(12) United States Patent
Jackson et al.

(10) Patent No.: US 8,097,400 B2
(45) Date of Patent: Jan. 17, 2012

(54) METHOD FOR FORMING AN ELECTRONIC DEVICE

(75) Inventors: Warren Jackson, San Francisco, CA (US); Carl Taussig, Woodside, CA (US); Ping Mei, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1708 days.

(21) Appl. No.: 11/062,384

(22) Filed: Feb. 22, 2005

(65) Prior Publication Data

US 2006/0188823 A1 Aug. 24, 2006

(51) Int. Cl.
*G03F 7/20* (2006.01)
(52) U.S. Cl. ........................................ 430/313
(58) Field of Classification Search .................. 430/311, 430/313, 322, 397
See application file for complete search history.

(56) References Cited

U.S. PATENT DOCUMENTS

| | | | |
|---|---|---|---|
| 5,292,625 A * | 3/1994 | McFadden et al. | 430/325 |
| 5,772,905 A | 6/1998 | Chou | |
| 6,007,324 A * | 12/1999 | Tzu et al. | 430/5 |
| 6,334,960 B1 | 1/2002 | Willson et al. | |
| 6,482,960 B1 | 11/2002 | Brechtelsbauer et al. | |
| 6,947,202 B2 * | 9/2005 | Liang et al. | 359/296 |
| 2002/0132482 A1 * | 9/2002 | Chou | 438/692 |
| 2003/0176034 A1 * | 9/2003 | Jackson et al. | 438/237 |
| 2004/0002216 A1 | 1/2004 | Taussig et al. | |
| 2004/0248410 A1 * | 12/2004 | Mok et al. | 438/689 |
| 2005/0074705 A1 * | 4/2005 | Toyoda | 430/323 |
| 2005/0089629 A1 * | 4/2005 | Nishimura et al. | 427/66 |
| 2006/0166143 A1 * | 7/2006 | Lin et al. | 430/313 |

* cited by examiner

*Primary Examiner* — Kathleen Duda
*Assistant Examiner* — Brittany Raymond

(57) ABSTRACT

Provided is a low cost system and method for forming electronic devices, especially large surface area devices. The process of imprint lithography is combined with alternate manufacturing techniques to fabricate the devices. Initially, a template imprints a three-dimensional pattern into a resist layer deposited on a flexible substrate. The resist layer is cured using ultraviolet light or other curing techniques. After curing, the 3-D pattern is modified using one of several techniques to include inkjetting, electrodeposition or laser patterning. In one embodiment, a semi-fluid material may be jetted into channels formed in the pattern, thereby forming conductive or insulating lead lines. Alternatively, a two-dimensional pattern may be jetted onto the resist layer. Final processing may include multiple etch-mask-etch steps. The integration of techniques into a single system provides a low cost, efficient method for manufacturing high quality, large surface area electronic devices.

29 Claims, 6 Drawing Sheets

8(a)

8(b)

8(c)

8d)

8(e)

8(f)

METHOD FOR FORMING AN ELECTRONIC DEVICE

FIELD OF THE INVENTION

This invention relates generally to the manufacture of electronic devices. More particularly, to a method and system for forming electronic devices using imprint lithography in combination with other forming techniques.

BACKGROUND

Given the current state of the art in micro-electronic devices, there is a need to develop low cost, high production rate fabrication techniques for large area electronics. Such techniques are important in the manufacture of large displays, electronic paper, electronic signage and large area sensing arrays. Because the surface area of these electronic devices is so large, the substrate material and fabrication processes should be relatively inexpensive if the finished products are to be reasonably priced, e.g. on the order of $10/ft$^2$ Typically, electronic devices may be fabricated using a lithography process such as photolithography. In this method of fabrication, the desired pattern is photographically projected onto a substrate to pattern a photoresist layer. The subsequent etching and deposition steps are used to add and subtract materials as required for a given layer. Subsequent layers are fabricated using additional photo-lithographically defined patterns.

For the photolithography method to result in useful devices, the deposited layers are often carefully aligned and the substrate is usually flat and dimensionally stable. The process also requires a low particulate environment, thereby necessitating a clean room. Further, there are limitations on the size of electronic devices that can be manufactured. Large areas are typically patterned using "step and repeat" sequential processing in order to achieve the desired large area device. All these requirements contribute to the current high cost of building appropriate fabrication facilities and manufacturing high quality, large area devices using photolithography.

In order to create low cost, large area electronic devices, several techniques have recently emerged as potential means for large area fabrication. Three such methodologies that can be used to form larger electronic structures include: jetting of material, imprint lithography, and laser scanning of patterns into a photoresist.

Using an inkjet technology similar to that used in ink jet printers, materials are added to a substrate or structure by the precise placement (jetting) of the materials required to define the desired electronic circuitry. This inkjet placement of materials is an additive process that adds material directly to the structure, often in the precise location desired. For layers with small area coverage, adding the actual electronic device materials is very economical and wastes little of the underlying or added materials. This is in contrast to subtractive or etch processes, wherein much of the various materials end up in waste solvents or gases. Significant material waste adds to the costs of materials and the costs associated with environmental compliance. An added feature of jetting is that the pattern of the jetted material can readily be changed to meet specific engineering requirements.

The disadvantages of the inkjet process described above include: (1) the process is not capable of printing features smaller than about 25 um because there is considerable variation in the drop trajectory; this variation also results in ragged feature delineations and splattering on a 10 um level; (2) the requirement to "inkjet" apply materials restricts the material set to those with fairly demanding viscosity, drying, and wetting requirements; (3) the process is inherently sequential and therefore has low throughput; and (4) accurate alignment of subsequent layers requires pattern identification, as well as control of the inkjet pen position.

Considering the second alternative, imprint lithography, a structure is defined by an imprint pattern that is imposed onto a liquid or deformable layer. Typically, a UV curable adhesive is patterned using a template. After patterning, the adhesive is hardened via UV exposure and then released from the template. Imprint lithography is capable of very high throughput because the structures are produced simultaneously across the entire imprint template/layer contact area. Moreover, the method is capable of very high resolution; features as small as 50 nm have been reported. The method is also compatible with flexible media or substrates.

The major disadvantage with imprint lithography is that it is difficult to align various layers. Typically the process may include masking followed by subtractive or etch processing steps wherein layer alignment is critical, especially with a flexible substrate. A layer is deposited and then patterned using a resist material that will ultimately define the structure during subsequent etching steps. Recently, a method of self-aligned imprint lithography, SAIL, has addressed many of the layer to layer alignment problems found with traditional imprint lithography techniques. The basics of this process are set forth and described in U.S. patent application Ser. No. 10/184,567, now U.S. Pat. No. 6,861,365, the disclosure of which is incorporated herein by reference.

The SAIL technique uses a 3D patterned resist and is typically employed in roll-to-roll processing. As the 3D resist is flexible, the pattern will stretch or distort to the same degree as the substrate. As such, a SAIL roll-to-roll fabrication process may be employed to provide low cost manufacturing solutions for devices such as flat and/or flexible displays, or other devices suitable for roll-to-roll processing. It should also be realized that the disclosed method may be employed using a non-flexible substrate while remaining within the spirit and scope of at least one embodiment. The SAIL process, like the jetting method discussed above, eliminates the need for expensive, ultra low particle count clean rooms. Further, photolithography is not required.

Finally, scanning laser technology is used to expose patterns directly into photoresist coated layers. A Meyer bar, gravure roller, slot-die coater, spin caster, or other device is used to deposit a well defined layer of photoresist over a deposited layer. A tightly focused laser is scanned across the layer, exposing the resist. Subsequently, the resist is developed, after which etching can be used to pattern the underlying layer.

Precision is important since the optical properties of the layers beneath the resist may affect the absorption of the laser energy within the resist layer. This technology is fundamentally subtractive, however it is capable of faster speeds than the jetting method, and does not require unique material properties such as those defined for jetted materials. The method shares with jetting technology the ability to adapt the pattern to conform to changes in the dimensions of the substrate associated with previous patterning steps.

Considered individually, none of the three processes described above, nor other processes disclosed in the prior art, provide for high volume, high quality, low cost fabrication of large area electronic devices. The previously known processes either do not "scale up" well for the manufacture of large devices, and/or the costs associated with wasted (removed) materials and low throughput are prohibitive.

Hence, there is a need for a system and method of forming electronic devices that overcomes one or more of the drawbacks identified above.

SUMMARY

The present disclosure advances the art and overcomes problems articulated above by providing a system and method for forming an electronic device.

In particular, and by way of example only, according to an embodiment, provided is a method for forming an electronic device including: providing a substrate; imparting a patterned resist layer upon a surface of the substrate; contemporaneously modifying a section of the imparted pattern; and post-modification processing of the electronic device to establish a required electronic circuitry.

DETAILED DESCRIPTION

Before proceeding with the detailed description, it is to be appreciated that the present teaching is by way of example, not by limitation. The concepts herein are not limited to use or application with one specific method for forming an electronic device. Thus, although the instrumentalities described herein are for the convenience of explanation, shown and described with respect to exemplary embodiments, it will be appreciated that the principals herein may be equally applied in other methods for forming an electronic device.

Figure 1:
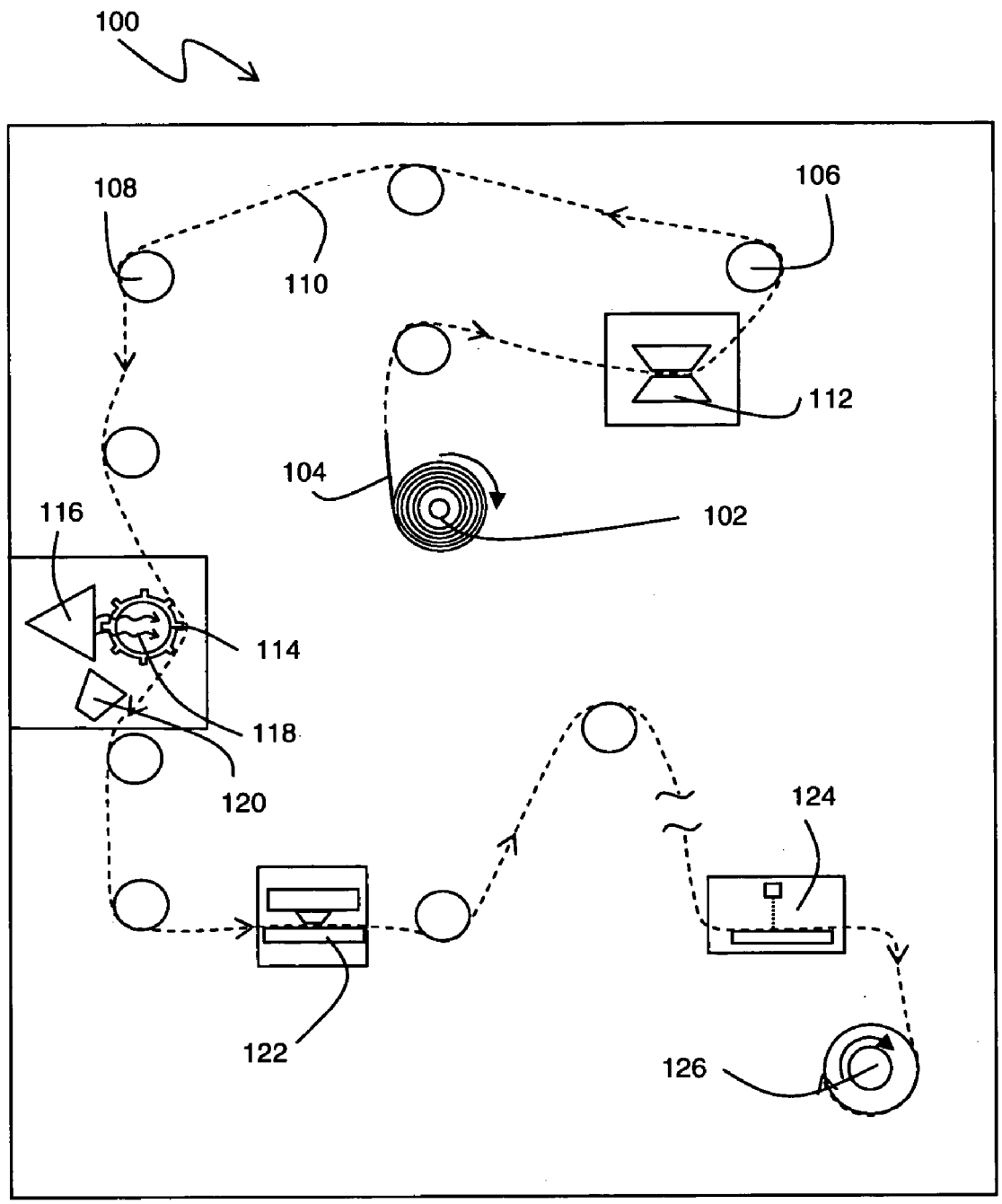
FIG. 1 is a plan view of a system for forming an electronic device according to an embodiment.

FIG. 1 shows a portion of a system 100 for forming an electronic device. The system 100 includes a supply roll 102 for providing a semi-flexible substrate 104. As shown, system 100 includes a plurality of rollers, of which rollers 106 and 108 are exemplary, for moving flexible substrate 104 along a pre-defined path 110. It should be noted that path 110 depicted in FIG. 1, as well as the positioning of certain components within the framework of system 100, is but one representation of an integrated system 100. As such, the representation of system 100 in FIG. 1 should not be viewed as limiting the scope and functionality of the claimed invention, except to the extent discussed in detail below. With respect to FIGS. 2 through 6, it understood and appreciated that the scale of the components and features illustrated in the Figures has been exaggerated to facilitate ease of discussion.

Still referring to FIG. 1, system 100 includes at least one subassembly 112 for imparting a patterned resist layer 200 (FIG. 2) upon a surface of a substrate 104. The subassembly 112 may be a Gravure coater or other such device well known in the pertinent art. In one embodiment, the resist layer 200 has substantially uniform thickness throughout, thereby creating a substantially planar surface 202 (FIG. 2) for receiving an imprint pattern. The resist layer 200 may be an UV curable adhesive or other polymer material. In at least one embodiment, the resist layer 200 is a UV curable adhesive.

Figure 3:
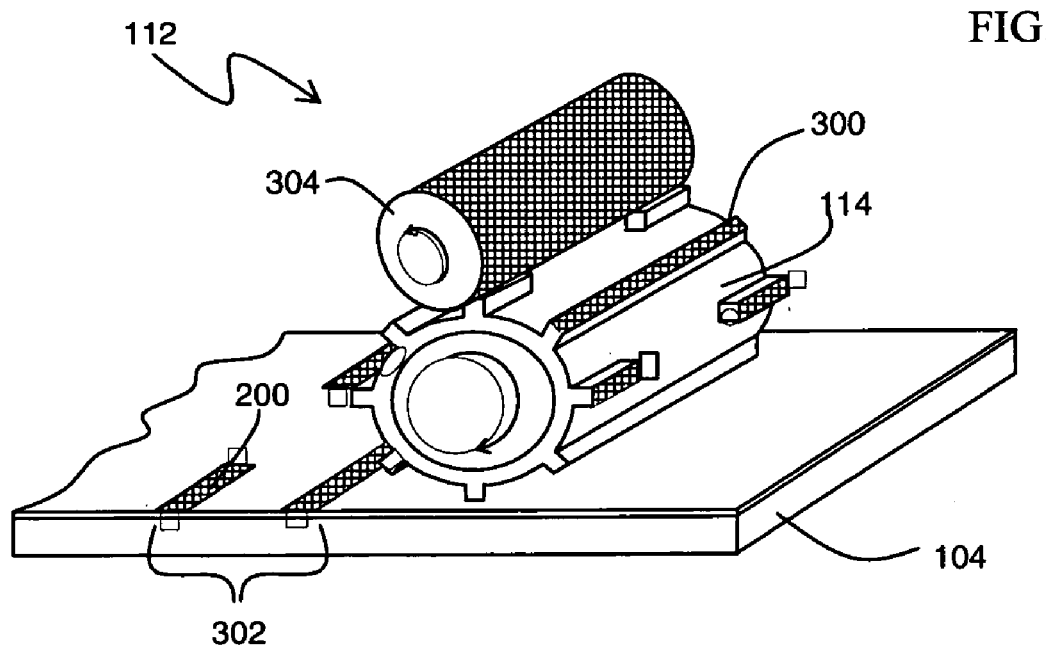
FIG. 3 is a perspective view showing the imparting of a pattern by printing in the resist layer according to an alternative embodiment.
Figure 4:
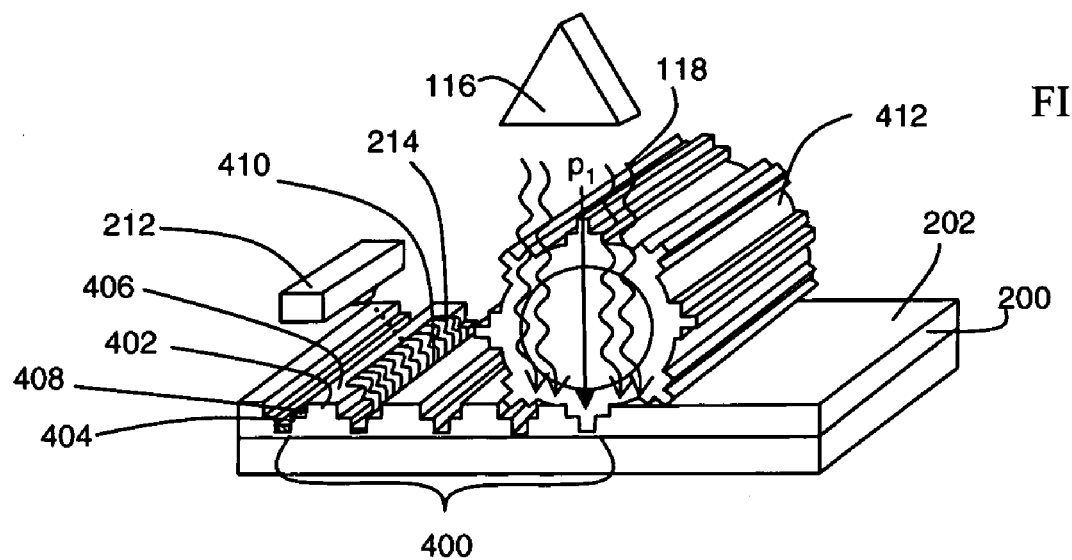
FIG. 4 is a perspective view showing the movement of a deposited semi-fluid material to a more energetically-favorable surface in a channel formed in the resist layer, according to an embodiment.

In yet another embodiment, the resist layer 200 may be imparted on substrate 104 by a template 114 via a printing rather than imprinting process (FIG. 3). The template 114 may be partially coated with a resist material 300, wherein template 114 has the characteristic of causing the resist material 300 to form a desired pattern 302 on substrate 104. As template 114 is brought into contact with substrate 104, the resist pattern 302 is transferred or printed onto substrate 104.

Specifically, in at least one embodiment, template 114 includes a contoured pattern of raised and depressed regions, as can be seen in FIG. 3. When brought into contact with a source of resist material, such as a resist coated roller 304, the raised regions of template 114 are coated with resist material. When template 114 is subsequently pressed into contact with substrate 104, the pattern of resist material is transferred to the substrate 104. In at least one embodiment, following the printing of resist pattern 302, the substrate 104 continues to move downstream for modification of the imparted resist pattern 302.

In at least one embodiment, resist pattern 302 is a substantially two-dimensional resist pattern. As used herein, reference to a resist pattern as two-dimensional is understood and appreciated to imply that the vertical separation of components within the pattern is not of significant importance. Although illustrated as a two-dimensional pattern for ease of discussion, the imparted patter 302 may also be three dimensional. As used herein, reference to a resist pattern as three-dimensional is understood and appreciated to imply that the vertical separation of components within the pattern is of significant importance. Three-dimensional patterns are more fully discussed below with respect to FIGS. 4-6.

In an embossing or imprinting embodiment, template 114 may be positioned "downstream" from deposition subassembly 112 (as shown in FIG. 1), or alternatively template 114 may be substantially co-located with subassembly 112. In a printing embodiment, template 114 is generally substantially co-located with subassembly 112 so that template 114 may receive resist material 300 from coated roller 304, as shown in FIG. 3. Moreover, depending upon the embodiment employed, the pattern is established by printing, imprinting, or combinations thereof.

In one embodiment, template 114 includes contoured features which are selectively wetted to detour adhesion of the resist material to the wetted features. Similar to the printing method described above, a pattern of resist material, which mirrors the pattern of non-wetted features on template 114, is transferred to substrate 104. In yet another embodiment, the imparting of a pattern onto substrate 104 may be via electrodeposition.

In the roll-to-roll process depicted in FIG. 1, template 114 is an embossing roller. It can be appreciated, however, that template 114 may be any of a type well known in the art for imprinting a three-dimensional pattern into a deformable resist layer 200, as part of an imprint lithography process. Stated differently, although the method depicted in FIG. 1 is a roll-to-roll process using an embossed roller, the present system 100 is not limited to this approach, and my employ any of a number of print or imprint methodologies known in the art.

Aligned with template 114 is an ultra-violet ("UV") light source 116, for use when the resist layer 200 is a UV curable material. In one embodiment, light source 116 is positioned to direct UV light 118 through a substantially transparent template 114 and onto resist layer 200, thereby curing the imprinted resist layer 200. In an alternate embodiment (not shown), light source 116 directs UV light 118 onto resist layer 200 through a substantially transparent substrate 104. Once resist layer 200 has cured, contact between template 114 and resist layer 200 is terminated, and template 114 is removed.

In yet another embodiment, UV light is not used to cure resist layer 200. Alternatively, resist layer 200 is a thermoplastic material. The thermoplastic is heated to a temperature in excess of the glass transition temperature ("$T_g$") for the material. Above $T_g$, resist layer 200 becomes sufficiently malleable to allow for imprinting using template 114. After the imprint process is complete, resist layer 200 is allowed to cool and harden, and template 114 is moved away from the hardened layer 200, thereby leaving a three-dimensional pattern imprinted in resist layer 200.

In close proximity to UV light source 116 and template 114 may be a cooling fan 120 for cooling template 114 and resist layer 200. In at least one embodiment, cooling fan 120 may be used to expedite cooling of resist layer 200 after imprinting at elevated temperatures, e.g. above $T_g$.

Figure 2:
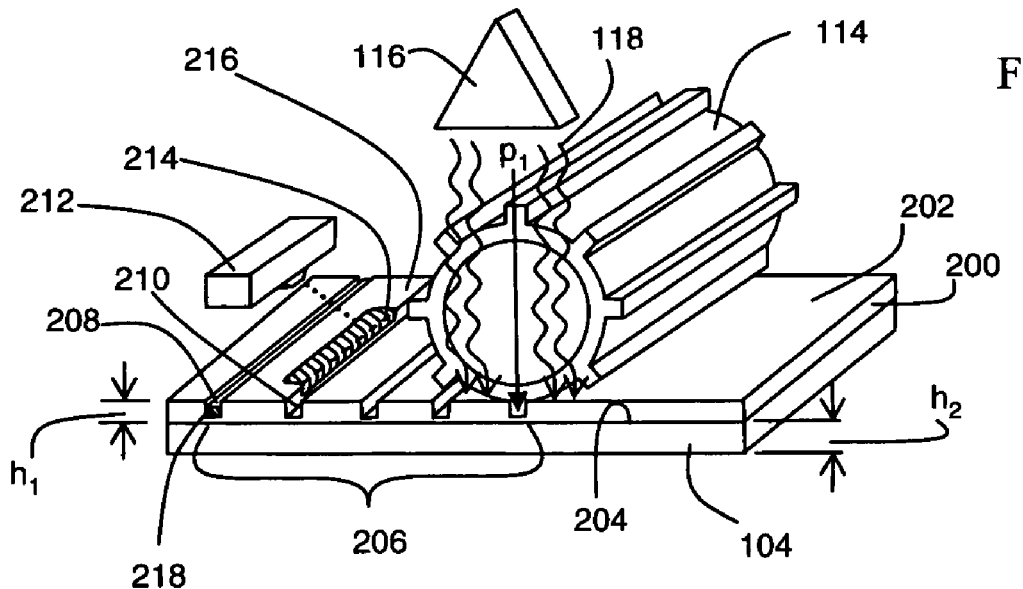
FIG. 2 is a perspective view showing the imparting of a pattern by imprinting and modification of the pattern in the resist layer according to an embodiment.

In addition to template 114 and UV light source 116, system 100 includes a modification subassembly 122 for modifying the pattern imprinted upon resist layer 200, see FIG. 2. In one embodiment, modification subassembly 122 is an inkjet device for jetting a semi-fluid material onto the surface 202 of resist layer 200, as discussed in greater detail below. In a second embodiment, modification subassembly 122 is a laser source for generating a laser beam. The laser beam is scanned across surface 202 of resist layer 200 to modify the pattern imprinted by template 114. Regardless of the particular embodiment, the modification of the imprint pattern occurs contemporaneously with the near-continuous imprinting of resist layer 200. As such, modification subassembly 122 may be substantially co-located with template 114, or somewhat further downstream as shown in FIG. 1.

A processing subassembly 124 is positioned to receive a substrate 114 having an imprinted resist layer 200 with a modified pattern. The processing subassembly 124 may be a vacuum chamber or other device known in the art for etching and otherwise cleaning resist layer 200 and/or substrate 114. In processing subassembly 124, the final electronic device circuitry is defined. For example, subassembly 124 may be a chamber and related components required for an ion etch.

It is generally understood that an ion etching process may be accomplished by either of two traditional processes—a physical process or an assisted physical process. In a physical etching environment, no chemical agent is provided. Rather, the removal of material is entirely dependent upon the physical impact of the ions knocking atoms off material surface 202 by physical force alone. Physical ion etching is commonly referred to as ion milling or ion beam etching. Physical ion etching is also typically referred to as a dry process. A physical etching process is typically very anisotropic. In at least one embodiment, the subsequent processing of the electronic device is accomplished with a dry etch process.

In an assisted physical etch process such as a reactive ion etching process, or RIE, removal of material results from the combination of chemical reactions and physical impact. Generally, the ions are accelerated by a voltage applied in a vacuum. The effect of their impact is aided by the introduction of a chemical which reacts with the surface being etched. The chemical reaction makes the surface softer and, as such, increases both the relative control of the etching as well as the etching rate. RIE is also a dry etching process because it is affected by a plasma at low pressure. Compared to a purely physical dry etch RIE tends to be more isotropic.

An RIE process advantageously permits very accurate etching of one or more layers with little appreciable affect upon other layers. In other words, specific selection of different materials permits an RIE process to soften one layer without significantly softening another. In at least one embodiment, the subsequent processing of the electronic device is accomplished with RIE.

Although ion etching and RIE have been described in conjunction with at least one embodiment, it is to be understood and appreciated by one of ordinary skill in the art that a variety of different etch or cleaning processes could be utilized without departing from the scope and spirit herein disclosed.

Often, multiple etch-mask-etch sequences are required to complete the manufacturing process and produce the final electronic circuitry. This post-modification processing may be executed in processing subassembly 124 in order to form the final electronic device. A take-up roll 126 is positioned down stream from the processing subassembly 124 for collecting finished product.

In the operation of system 100, in at least one embodiment, the fabrication process is commenced on a flexible substrate 104 dispensed from supply roll 102. The rate at which substrate 104 is dispensed is predetermined based on the various operations required during the roll-to-roll processing of the electronic device. A continuous sheet of substrate material moves along path 110 to pass through the deposition subassembly 112.

In deposition subassembly 112, a deformable resist layer 200 is deposited on substrate 104. Cross-referencing for a moment FIG. 1 and FIG. 2, it can be seen that resist layer 200 typically has a thickness or height "$h_1$" less than the height "$h_2$" of substrate 104. Such a difference in height has been selected for purposes of illustration only, as it is understood and appreciated that in most applications the height of the resist layer 200 may be substantially less than the height of the substrate 104. As shown, resist layer 200 has an exposed surface 202 which is substantially planar and parallel to the top surface 204 of substrate 104. The resist layer 200 may include a photoresist layer (not shown) deposited on the surface 202 of layer 200.

After exiting deposition subassembly 112, substrate 104 with resist layer 200 continues along path 102 until it reaches template 114. Upon reaching template 114, the template 114 and substrate 104 are moved into intimate contact such that template 114 exerts a pressure "$p_1$" on surface 202 of deformable resist layer 200 (see FIG. 2). The surface 202 deforms under pressure "$p_1$", and a pattern 206 is imprinted into resist layer 200. In the embodiments shown in FIGS. 2-6, template 114 is an embossing roller which rolls over surface 202 to create the pattern. In another embodiment (not shown), a template may be a rigid structure juxtaposed with and substantially parallel to surface 202. In this embodiment, the entire template is moved in a direction substantially perpendicular to surface 202 until the template contacts surface 202 with sufficient force to imprint a pattern, e.g. pattern 206, in resist layer 200.

As can be seen in FIG. 2 pattern 206 is a three-dimensional pattern which may comprise, in at least one embodiment, a plurality of channels, of which channels 208 and 210 are exemplary. Additionally, as can best be seen in FIG. 4, a pattern 400 may comprise a plurality of different vertical protrusions or vertical heights, for example vertical heights 402 and 404. As shown, vertical heights 402 and 404 define surfaces substantially parallel to surface 202, such as surfaces 406 and 408. Further, pattern 400 includes channels such as channel 410. The pattern transferred to resist layer 200 is defined by taking into account the final circuitry desired for the electronic device, as well as the etch-mask-etch steps required to form the final circuitry.

Referring once again to FIG. 1 and FIG. 2, as template 114 remains in intimate contact with resist layer 200, UV light source 116 illuminates resist layer 200 with UV light 118. Illumination of resist layer 200 cures the resist material into a semi-rigid structure.

After resist layer 200 is sufficiently cured, the imprinted pattern 206 is further modified. FIG. 1 shows the substrate 104/resist layer 200 stack moving further "downstream" to modification subassembly 122. Alternatively, as can best be appreciated by referring to FIGS. 2-6, modification of imprinted pattern 206 (or a printed two-dimensional pattern not shown) may occur in concert with the use of template 114.

Considering now the subsequent modification of the imprinted pattern 206, in one embodiment an inkjet device 212 deposits a semi-fluid material 214 onto a surface 216 of pattern 206. The semi-fluid material 214 may be any one of a type well known in the art for inkjet printing circuit boards. For example, semi-fluid material 214 may be a conductive ink having embedded metal particles to enhance conductivity. Alternatively, semi-fluid material 214 may be an insulating ink. As with traditional visible ink applied by an ink-jet printer, once applied the semi-fluid material 214 will undergo a state change (e.g. dry) to substantially remain when and where placed.

The chemical and electrical nature of semi-fluid material 214 should be consistent with the electrical requirements of the device being manufactured. Further, in at least one embodiment, the ink, whether conductive or insulative, should be etch resistant in order to "survive" subsequent processing steps. Of note, once hardened semi-fluid material 214 is typically resistant to chemical and other forms of etching.

Preferably, surface 216 is a wetted surface, thereby making channel 210 more energetically favorable than surface 216 for semi-fluid material 214. In this condition, semi-fluid material 214 can easily move into channel 210. Alternatively, if there is no wetting of surface 216, or if the surface tension of jetted semi-fluid material 214 is so strong that movement into channel 210 is energetically unfavorable, material 214 will remain on surface 216.

In addition to wetting surface 216, other methods may be used to induce semi-fluid material 214 to move into channel 210. For example, agitation of substrate 104 will cause material 214 to move off surface 216 and into channel 210. More specifically, substrate 104/resist layer 200 stack can be vibrated, thereby inducing material 214 to move. Another form of agitation is to simply tilt the entire substrate 104/resist layer 200 stack such that the gravitational inclination of material 214 is to move into channel 210.

Figure 5:
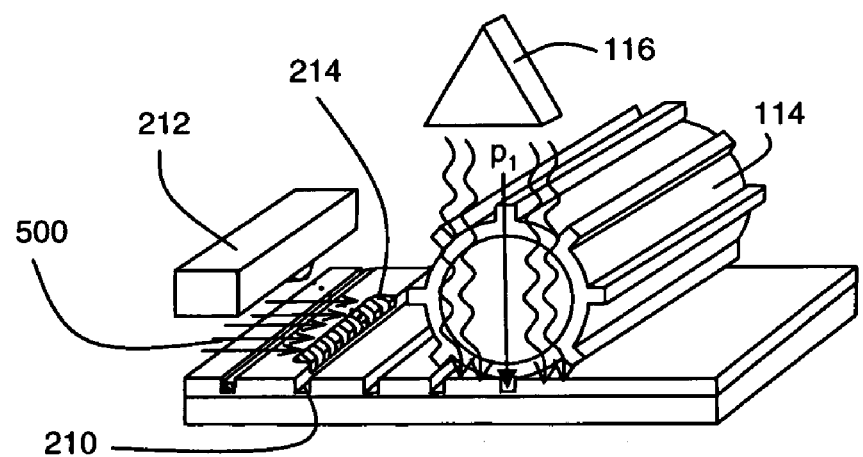
FIG. 5 is a perspective view showing an air-induced movement of a deposited semi-fluid material into a channel formed in the resist layer, according to an embodiment.

Alternatively, as shown in FIG. 5, a stream of air 500 may be directed toward semi-fluid material 214, forcing semi-fluid material 214 to flow toward and into channel 210. The process of moving semi-fluid material 214 into channel 210 may occur concurrent with the jetting process, or it may occur sequentially, after semi-fluid material 214 has been jetted onto surface 216.

Referring once again to FIG. 2, as semi-fluid material 214 moves off surface 216 and into channel 210, semi-fluid material 214 begins to accumulate in channel 210. Eventually, sufficient semi-fluid material 214 accumulates to form a continuous conductive or insulating lead line 218. An advantage to jetting semi-fluid material 214 in this manner is that as semi-fluid material 214 starts to accumulate in channel 210, semi-fluid material 214 begins to harden immediately, thereby reducing the overall time required to form a lead line 218. The pattern of jetted lead lines, e.g. line 218, may subsequently be masked during processing, or the pattern may remain exposed as part of the final device circuitry.

In an alternate embodiment, as shown in FIG. 5, a template 412 has a more complex three-dimensional pattern. As shown, template 412 imprints a pattern 400 into the resist layer 200 as discussed above. Semi-fluid material 214 is jetted onto surface 406, which may or may not be a wetted surface. Due in part to the tiered structure of pattern 400, semi-fluid material 214 is induced to move from surface 406 into channel 410. As with the manufacturing process depicted in FIG. 2, semi-fluid material 214 eventually accumulates in channel 410, forming lead lines such as line 316.

Similar to the process depicted in FIG. 2, external means may be used to help move semi-fluid material 214 into the channel 410. As discussed in detail above, these means may include, but not limited to, agitation of substrate 200 or pressure from air directed at semi-fluid material 214.

Figure 6:
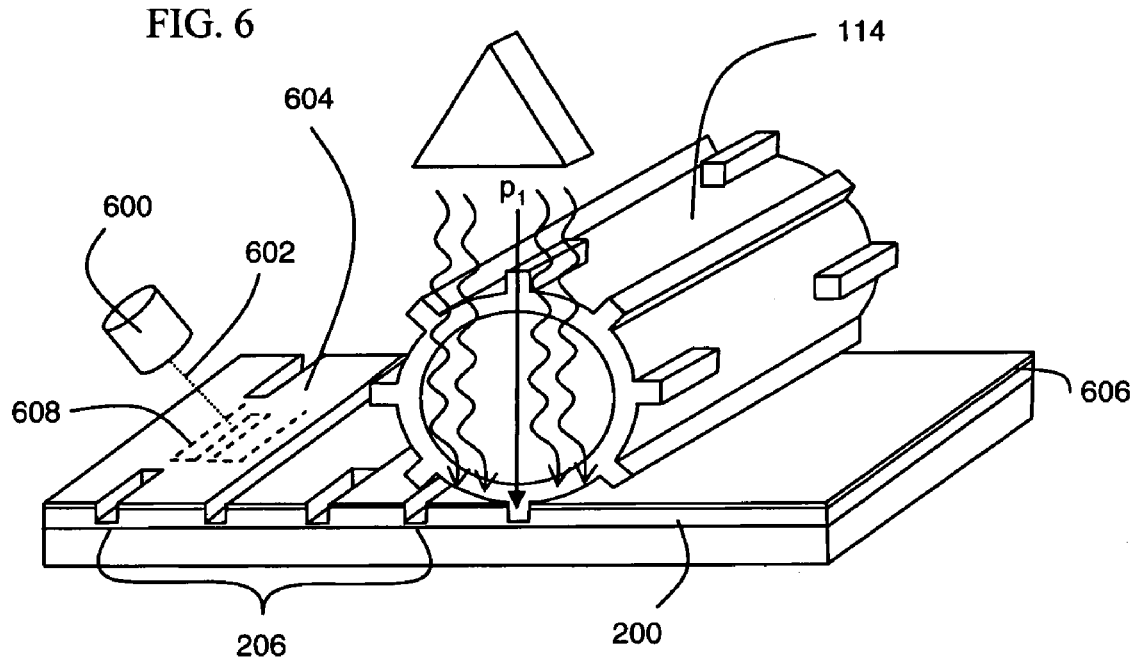
FIG. 6 is a perspective view showing a modification of a pattern imprinted in the resist layer according to an embodiment.

In addition to using an inkjet process to modify patterns 206, 302 and 400, laser patterning may be used in combination with a deposited photoresist material. As shown in FIG. 6, a laser source 600 scans a laser beam 602 across a surface 604 of a photoresist layer 606 deposited as the top layer of resist layer 200. The laser beam 602 defines a secondary pattern 608 on surface 604. Subsequent development of photoresist layer 606 reveals the secondary pattern 608. Using a process well known in the pertinent art, secondary pattern 608 can subsequently be etched into the underlying substrate 200.

Once modification of the imprinted pattern is complete, using either ink jet materials or laser patterning, the next step in the forming process is for the substrate 104/resist layer 200 stack to move downstream to processing subassembly 124. Downstream processing in subassembly 124 may include additive or subtractive (e.g. RIE) processes to transfer patterns onto surface 204 of substrate 104, as discussed in greater detail above. A series of etch-mask-etch processes may be used to create desired circuit patterns and features on one or more layers of the electronic device.

The degree to which the substrate 104/resist layer 200 stack is processed in processing subassembly 124 will depend on the final device design. Complex electronic devices may require multiple processing steps, e.g. etching, to finalize the circuit pattern(s).

It is to be appreciated that the processes described above may be iterative and integrated. Stated differently, multiple printing and/or imprinting processes may be required, in conjunction with multiple processing steps in subassembly 124. The nature and number of manufacturing steps required is determined by the ultimate design of the electronic device.

Figure 7:
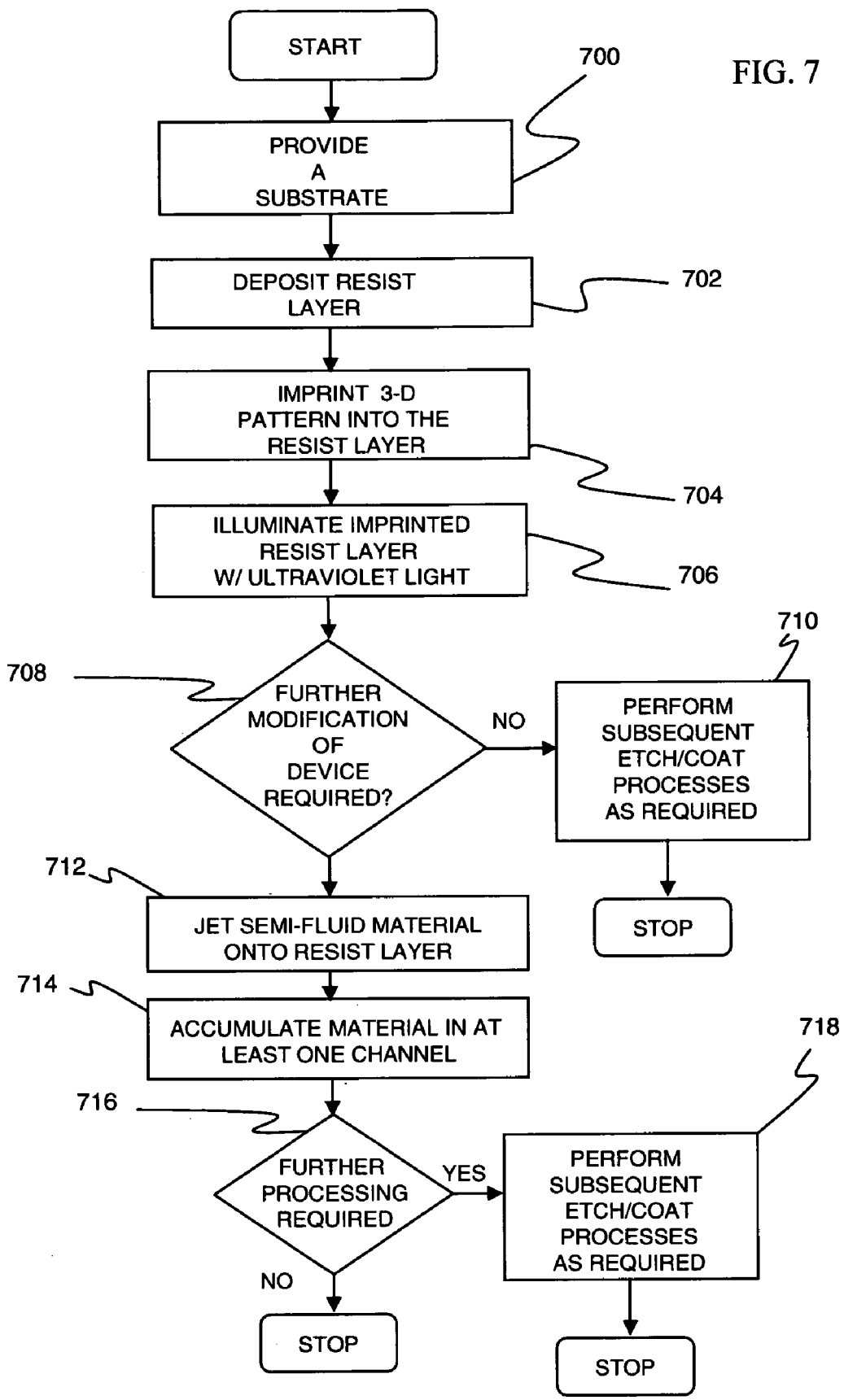
FIG. 7 is a flowchart of a method for forming an electronic device, according to an embodiment.
Figure 8:
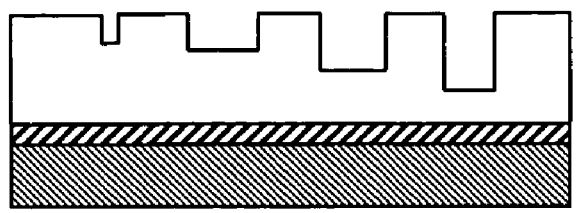
FIG. 8 is a side view of a formed electronic device showing the sequential steps used to manufacture the device, according to an embodiment.
Figure 8:
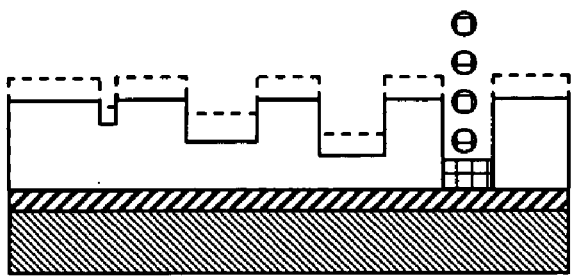
Figure 8:
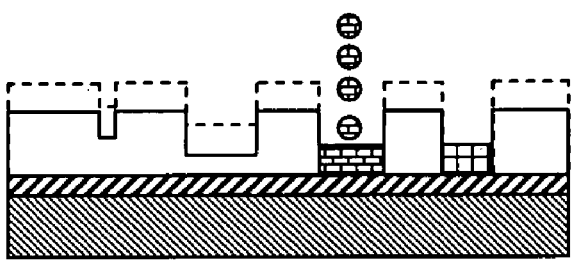
Figure 8:
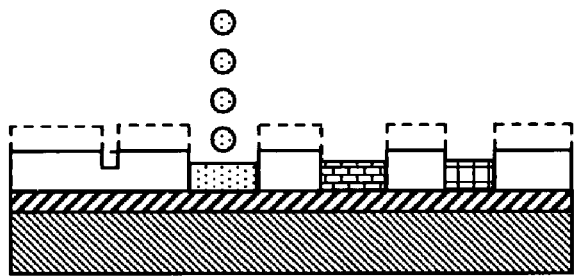
Figure 8:
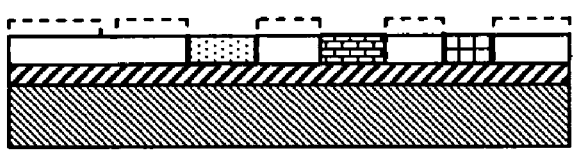
Figure 8:
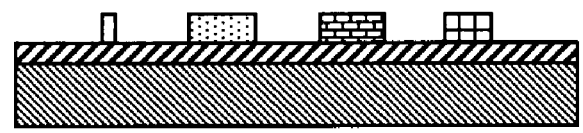

The flowchart of FIG. 7 and steps represented of FIG. 8 are provided to summarize at least one embodiment for forming an electronic device. It will be appreciated that the described process need not be performed in the order in which the process is herein described, but that this description is merely exemplary of at least one preferred method of forming an electronic device, in accordance with system 100. As shown in FIG. 8, the processes of imparting a pattern and etching a resist layer may be iterative. The process discussion below makes reference to structural elements shown and identified in FIGS. 1 and 2 above.

In at least one embodiment, the process is commenced by providing a substrate, block 700, which may or may not be flexible. If roll-to-roll processing is selected as the baseline manufacturing technique, the substrate is usually sufficiently flexible to be rolled. In a second step of the process, block 702, a deformable resist layer is deposited on the substrate. The resist layer may include a photoresist layer if later processing of the modified pattern will include laser patterning.

After the resist layer is deposited on the substrate, a three-dimensional pattern is imprinted in the resist layer by a template, block 704 (see also FIG. 8(a)). In one embodiment, the resist layer is subjected to UV light until the imprinted layer is sufficiently cured, block 706. The pattern may include wetted surfaces for use during a subsequent ink-jet process.

Further modification of the imprinted pattern may or may not be required, depending on the design of the electronic device (block 708). If no further modification to the pattern is required, the "substrate/resist layer" stack is subjected to additional etch-mask-etch processes until the finished product is achieved, as described in U.S. patent application Ser. No. 10/184,567, now U.S. Pat. No. 6,861,365. These subsequent processing steps are represented by block 710 in FIG. 7.

If further modification of the initial imprinted pattern is required, one embodiment of the present system 100 includes jetting a semi-fluid material onto a surface of the imprinted pattern, block 712/FIG. 8(b). Through one of several methods discussed in detail above, the jetted material is induced to accumulate in at least one channel of the imprinted pattern, block 714. Of note, the placement of semi-fluid material on the wetted surfaces may be closely controlled such that material accumulates in one or more channels. Once the semi-fluid material has accumulated in the channel(s), the material hardens to form the lead lines which constitute the modification to the previously imprinted pattern.

The pattern of circuitry formed by the jetted lead lines may solely define the required electronic circuitry. However, further processing may be required for the "substrate/resist layer/lead line" stack (block 716). If subsequent processing is required, this processing may be similar to that described in the above referenced U.S. Patent Application, and may include multiple events of etching the imprinted pattern and depositing semi-fluid material (FIGS. 8(c) and 8(d)).

Subsequent post-modification processing, such as masking, etching, and cleaning, block 718, results in a final structure and electronic device, as shown in FIGS. 8(e) and 8(f). Once the final electronic device circuitry is defined, the device is finally cleaned and the formation process is stopped.

Changes may be made in the above methods, devices and structures without departing from the scope hereof. It should thus be noted that the matter contained in the above description and/or shown in the accompanying drawings should be interpreted as illustrative and not in a limiting sense. The following claims are intended to cover all generic and specific features described herein, as well as all statements of the scope of the present method, device and structure, which, as a matter of language, might be said to fall therebetween.

What is claimed is:

1. A method for forming an electronic device comprising:
providing a moving substrate and a resist layer on a surface of the moving substrate;
imparting a first pattern onto the resist layer with the use of a template roller;
contemporaneously modifying a section of the imparted first pattern on the resist layer proximate to the template roller, wherein modifying the section comprises scanning a laser beam across the section of the first pattern to impart a second pattern to the first pattern on the resist layer and developing the resist layer to manifest the second pattern;
modifying the second pattern by jetting a semi-fluid material into the second pattern; and
post-modification processing of the electronic device to establish a required electronic circuitry.

2. The method of claim 1, wherein imparting the first pattern onto the resist layer further includes:
depositing the resist layer onto the surface of the moving substrate;
moving the template roller into contact with the resist layer, wherein the template roller exerts pressure on the resist layer and imprints a pattern in the resists; and
hardening the patterned resist layer.

3. The method of claim 2, wherein the resist layer is an ultraviolet curable layer, the first pattern imparted in the resist layer being subsequently cured using an ultraviolet light.

4. The method of claim 2, wherein the resist layer is a thermoplastic heated to a temperature above its glass transition temperature, Tg, prior to moving the template roller into contact with the resist layer.

5. The method of claim 1, wherein imparting the first pattern onto the resist layer further includes:
depositing the resist layer upon the moving substrate;
moving the template roller into contact with the moving substrate, wherein the first pattern is transferred from the template roller to the moving substrate; and
hardening the patterned resist layer.

6. The method of claim 5, wherein the resist layer is an ultraviolet curable layer, the first pattern imparted in the resist layer being subsequently cured using an ultraviolet light.

7. The method of claim 6, wherein the template roller is substantially transparent and wherein the ultraviolet light is passed through the template roller to cure the first pattern imparted in the resist layer.

8. The method of claim 5, wherein the resist layer is a thermoplastic heated to a temperature above its glass transition temperature, Tg, prior to moving the template roller into contact with the resist layer.

9. The method of claim 1, wherein imparting the first pattern onto the resist layer is a process selected from the group of printing, imprinting, embossing, laser scanning, and combinations thereof.

10. The method of claim 1, further including an underlying structure below the surface of the moving substrate, wherein the modifying alters the underlying structure as required to refine a final design of the device.

11. The method of claim 10, wherein the underlying structure is a previously patterned structure on the moving substrate.

12. The method of claim 1, wherein the first pattern is a three-dimensional pattern.

13. The method of claim 1, wherein the first pattern is a two-dimensional pattern.

14. The method of claim 1, further comprising:
further modifying the second pattern through an additive process selected from the group consisting of electrodeposition of material, chemical deposition of material, and combinations thereof.

15. The method of claim 1, further comprising:
further modifying the second pattern through a subtractive process selected from the group consisting of dry etching, wet etching and combinations thereof.

16. The method of claim 1, wherein the moving substrate is flexible.

17. The method of claim 1, wherein the semi-fluid material is an etch resistant conductive ink having embedded metal particles.

18. The method of claim 1, wherein the semi-fluid material is an etch resistant insulating ink.

19. The method of claim 1, wherein jetting further comprises:
  depositing the semi-fluid material onto a surface of the resist layer; and
  inducing the semi-fluid material to accumulate in at least one channel of a three-dimensional pattern in the resist layer.

20. The method of claim 1, wherein the modifying is performed upon a first portion of the resist layer as the template roller continues to impart a pattern to a second portion of the resist layer.

21. A method for forming an electronic device comprising:
  providing a roll-to-roll processing system having at least a template roller, a modification subassembly and a processing subassembly and a predefined path therebetween;
  providing a moving substrate and a resist layer on a surface of the moving substrate along the path;
  imparting a first pattern onto the resist layer with the use of the template roller and directing the moving substrate along the path to the modification subassembly;
  contemporaneously modifying a section of the imparted first pattern on the resist layer upon the moving substrate as the moving substrate passes along the path from the template roller to the modification subassembly, wherein modifying the section comprises scanning a laser beam across the section of the first pattern to impart a second pattern to the first pattern on the resist layer and developing the resist layer to manifest the second pattern;
  modifying the second pattern by jetting a semi-fluid material into the second pattern; and
  directing the modified resist layer along the path for post-modification processing of the electronic device by the processing subassembly to establish a required electronic circuitry.

22. The method of claim 21, wherein imparting the first pattern onto the resist layer is a process selected from the group of printing, imprinting, embossing, laser scanning, and combinations thereof.

23. The method of claim 21, further comprising:
  further modifying the second pattern through one of a first instance that includes an additive process selected from the group consisting of electrodeposition of material, chemical deposition of material, and combinations thereof, and a second instance that includes a subtractive process selected from the group consisting of dry etching, wet etching and combinations thereof.

24. The method of claim 21, wherein the modifying is performed upon a first portion of the resist layer as the template roller continues to impart a pattern to a second portion of the resist layer.

25. The method of claim 21, wherein the template roller is substantially transparent, said method further comprising:
  passing ultraviolet light through the template roller to cure the first pattern imparted in the resist layer.

26. A method for forming an electronic device comprising:
  providing a moving flexible substrate with a resist layer disposed thereon to a template roller;
  imparting a first pattern to a first portion of the resist layer upon the moving substrate as the moving substrate is passed to a modification subassembly adjacent to the template roller;
  contemporaneously modifying the first portion of the first pattern on the resist layer as the template roller continues to impart another first pattern to a second portion of the resist layer upon the moving substrate, wherein modifying the first portion comprises scanning a laser beam across the section of the first pattern to impart a second pattern to the first pattern on the resist layer and developing the resist layer to manifest the second pattern, the modified first portion and imparted second portion maintaining a spatially precise relationship due to the contemporaneous acts of modifying and imparting;
  modifying the second pattern by jetting a semi-fluid material into the second pattern; and
  post-modification processing of the electronic device to establish a required electronic circuitry.

27. The method of claim 26, wherein imparting the first pattern onto the resist layer is a process selected from the group of printing, imprinting, embossing, laser scanning, and combinations thereof.

28. The method of claim 26, further comprising:
  further modifying the second pattern through one of a first instance that includes an additive process selected from the group consisting of electrodeposition of material, chemical deposition of material, and combinations thereof, and a second instance that includes a subtractive process selected from the group consisting of dry etching, wet etching and combinations thereof.

29. The method of claim 26, wherein the template roller is substantially transparent, said method further comprising:
  passing ultraviolet light through the template roller to cure the first pattern imparted in the resist layer.

* * * * *